United States Patent
Tatoh

[19]

[11] Patent Number: 6,163,072
[45] Date of Patent: Dec. 19, 2000

[54] SEMICONDUCTOR DEVICE PACKAGE AND SEMICONDUCTOR DEVICE MODULE

[75] Inventor: Nobuyoshi Tatoh, Itami, Japan

[73] Assignee: Sumitomo Electric Industries, Ltd., Osaka, Japan

[21] Appl. No.: 09/115,834

[22] Filed: Jul. 15, 1998

[30] Foreign Application Priority Data

Jul. 15, 1997 [JP] Japan ................................ 9-207148

[51] Int. Cl.[7] ................................................. H01L 23/12
[52] U.S. Cl. ............................ 257/704; 257/99; 257/433
[58] Field of Search ..................................... 257/431, 433, 257/704, 99; 359/248

[56] References Cited

FOREIGN PATENT DOCUMENTS

| | | |
|---|---|---|
| 1-107141 | 7/1989 | Japan . |
| 2-28350 | 1/1990 | Japan . |
| 6-112345 | 4/1994 | Japan . |
| 7-234337 | 9/1995 | Japan . |

OTHER PUBLICATIONS

Yamaguchi, et al., "New Module Structure Using Flip–Chip Technology for High Speed Optical Communication ICs", IEEE MTT–S Digest, Jun. 1996, pp. 243–246.

*Primary Examiner*—Carl Whitehead, Jr.
*Assistant Examiner*—Roy Potter
*Attorney, Agent, or Firm*—Pillsbury, Madison & Sutro, LLP

[57] ABSTRACT

A package storing semiconductor devices and circuit boards with a cap having a plurality of conductive protrusions whose intervals are shorter than or equal to $\{c/(2v\ \epsilon^{1/2})\}$, where c is the light velocity, v is the maximum frequency of signals, and $\epsilon$ is the dielectric constant of the circuit boards. The protrusions attenuate the transmission of electromagnetic waves to reduce noise, cross-talk, parasitic oscillations, etc.

23 Claims, 6 Drawing Sheets

SEMICONDUCTOR DEVICE PACKAGE AND SEMICONDUCTOR DEVICE MODULE

BACKGROUND OF THE INVENTION

Field of the Invention

This invention relates to a package, a cap and a module for optoelectronic semiconductor devices which are required to operate at a high speed in optoelectronic communication systems. In particular, this invention relates to an airtight package and a cap for semiconductor devices containing optoelectronic devices and peripheral ICs. The term "optoelectronic devices" is used herein to refer to a device which converts electric signals to light signals or vice versa. Examples of optoelectronic devices are a laser diode (LD), a light emitting diode (LED), and a photodiode (PD). The term "peripheral IC" is used to refer to a device which somehow processes electrical signals associated with an LD or an LED or electrical signals from a PD. Examples include an amplifier, a comparator, a multiplexer and a demultiplexer. Small-sized packages are excluded from the scope of the present invention. Low-speed operating semiconductor devices are also excluded from the consideration of the invention. The object of the invention is an improvement of a large-sized package for installing high-speed operating semiconductor devices.

This invention is particularly applicable to such large packages and caps having at least a side of a length Q which satisfies an inequality $Q \geq c/(2v \epsilon^{1/2})$, where c is the velocity of light ($3 \times 10^{11}$ mm/s) in vacuum, v is the maximum frequency (Hz) at which the device operates, and $\epsilon$ is the dielectric constant of the circuit plate of the semiconductor device stored in the package. The purpose of the invention is to suppress parasitic oscillation, cross-talking, and noise caused by uncontrollable interactions among devices in such a large package.

This application claims the priority of Japanese Patent Application No.9-207148 (207148/97) filed Jul. 15, 1997 which is incorporated herein by reference.

DESCRIPTION OF RELATED ART

Conventional semiconductor modules, in general, are produced by die-bonding, wire-bonding or welding optoelectronic devices (LD, PD, LED etc.), capacitors, filters or circuit plates in a package and airtightly (hermetically) sealing the package using a cap made of ceramic or metal in an inactive gas atmosphere. The packages for semiconductor devices, hereinafter referred to as "semiconductor packages", according to the present invention are not cheap plastic-mold packages for memory ICs or other ICs but large-sized and expensive packages made of ceramics. The package includes a main body and a cap. Both the main body and the cap are made of ceramics. Typically the main body has a bottom plate, a rear plate and a front plate and two side plates, with an open top. The cap covers the top opening of the main body. Parts of surfaces of main bodies, sometimes, are metallized for various purposes. Caps are usually made entirely of ceramics without any metal parts. In some cases, caps are partially metallized for welding to main bodies. Metallized wire patterns are usually printed on parts of the main body for electrically connecting electrode pads of inner circuits to outer devices. Each of the terminals of the metallized wire patterns has a lead pin connected to it. A lead frame having lead pins is usually fixed to the metallized patterns by brazing.

Ceramic semiconductor packages have various sizes and shapes depending upon the purposes of the semiconductor devices to be packaged in them. However, all have wire patterns, lead pins and a space for storing circuit plates having semiconductor devices in its main body. The bottom plate is sometimes equipped with a heat diffusing plate, for example, a CuW (copper-tungsten) plate for enhancing thermal conductivity or thermal diffusivity. The ends of the wire patterns are connected to the beginning ends of the lead pins by wirebonding. The circuit plates are sometimes made of epoxy resin and other times made of ceramics, for example, alumina. Natural (passive) cooling relying upon the high heat conduction of ceramic materials is often sufficient for keeping the device within an appropriate temperature range. This is generally true for packages containing ordinary low-power electronic devices. However, high-power devices which throw off a large amount of heat, e.g., a laser diode, require the use of a special cooling device, such as for example, a Peltier device in the package for cooling the device and stabilizing the temperature.

There are two well known ways to hermetically seal a semiconductor package. One way is carried out by thinning the periphery of the cap, making a central projection part on the cap, inserting the central projection part into the top opening of the main body and welding the junctions in an inactive gas atmosphere. The other way of hermetic sealing is carried out by painting the periphery of the bottom surface of the cap with an AuSn solder, mounting the cap on the tops of the front, rear and side plates of the package main body, heating the cap and the main body and soldering the cap to the main body. FIG. 1 is an exploded perspective view of a known package.

A ceramic package main body 1 is a rectangular box having a top opening. The main body is made by piling ceramic frames on a ceramic plate. Thus, the main body has a bottom plate, a front plate, a rear plate and two side plates. The side plates have terminal plates 2 inserted in holes formed in the side plates. The terminal plates 2 have metallized wire patterns on their top surfaces. Leads 3 are brazed at ends of the metallized wire patterns. A circuit plate 4 is mounted on the bottom plate of the main package body 1. The circuit plate 4 has metallized patterns. FIG. 1 is an example of a PD module containing the PD chip 5. In this example, a PD (photodiode) chip 5 and an amplification IC 6 are soldered on the metallized patterns. A fiber hole 7 is perforated on an end wall of the package. The package has bottom brackets 8 for fixing the package to same body. A cap 9 covers the top opening of the main body 1.

FIG. 2 is a side view of the cap 9. The periphery of the bottom surface of the cap 9 is thinned into a side margin 10. The rest of the bottom surface is not thinned. Vertical side steps 11 are formed by the thinned margin 10. The side steps 11 will be inserted into the top opening of the package main body 1.

The main body 1 of the package has a large inner space for storing semiconductor devices. If the devices operate at a low speed (low frequency), such a wide, empty space causes no difficulty. However, if the package contains high speed operating devices, the large, empty space in the package causes difficult problems of cross-talk among devices, noise generation and parasitic oscillation.

Some improvements have been proposed for preventing the cross-talk, the parasitic oscillation and the noise generation caused by the interaction among the devices operating at high speeds in a large semiconductor package. All of these improvements have made use of partition walls provided within the packages for isolating high speed devices from one another, thereby preventing the difficulties of mutual interactions among them. They were based upon the idea that the partition walls can prevent the electromagnetic waves produced by some devices from propagating to other devices within the space of the package. The following describes some of the attempts to solve the problem.

(1) Japanese Laying Open Application No.7-234337 (234337/'95) entitled "MODULE STRUCTURE FOR OPTICAL COMMUNICATION" suggests a package having a cap equipped with a downward projecting partition. The downward partition is a metal plate fixed to the rear surface of the cap by a bolt. The projection partition is expected to prevent cross-talk, parasitic oscillation, etc.

(2) Japanese Utility Model Laying Open No.1-107141 (107141/'89) entitled "HIGH FREQUENCY SEMICONDUCTOR DEVICE" suggested a semiconductor package having a vertical conductive shield plate for suppressing cross-talk between a signal sending port and a signal receiving port. The package has a signal sending circuit on one half side and a signal receiving circuit on the other half side. Thus, the shield plate is fixed at the middle of the bottom surface of the cap. Since the receiving circuit and the sending circuit are installed in symmetric positions in the package, the middle metal shield can effectively suppress coupling between the sending circuit and the receiving circuit.

(3) Japanese Patent Laying Open No.6-112345(112345/'94) entitled "METHOD AND STRUCTURE OF MOUNTING A HIGH FREQUENCY INTEGRATED CIRCUIT" discusses the problem of a difference between the ground voltage of a circuit plate and the ground voltage of a package storing ICs for high frequency operation. Narrow through-holes connect the ground of the circuit plate with the ground of the package. When the operation frequency of the devices is high, the ground voltage of the circuit plate deviates from the ground voltage of the package. When the package is closed by covering the main body with a cap, the state of operation changes due to the instability of the ground voltages. This utility model suggests introducing a large metal block into the package and connecting the ground of the circuit plate to the ground of the package using this metal block. Since the metal block which has a large bulk with a low resistance connects these grounds with each other instead of through narrow holes, the ground voltages are effectively stabilized between the circuit plate and the package (case).

(4) Japanese Patent Laying Open No.2-28350 entitled "HIGH FREQUENCY SEMICONDUCTOR DEVICE" proposed a package having a signal receiving circuit and a signal sending circuit placed at symmetric spots and a partition positioned just at the middle of the package for suppressing cross-talk between the sending circuit and the receiving circuit.

(5) A publication by Satoshi Yamaguchi, Yuhki Imai, Shunji Kimura and Hideki Tsunetsugu entitled "NEW MODULE STRUCTURE USING FLIP-CHIP TECHNOLOGY FOR HIGH-SPEED OPTICAL COMMUNICATION ICS", appearing in the IEEE MTT-S Digest 243(1996), suggested the use of a chip-sized cavity. This document touts the advantages of using a narrow case (package) which encloses chips with narrow gaps for suppressing spatial propagation of electromagnetic waves within the case.

Semiconductor packages have been carrying greater and greater numbers of ICs and other devices with higher density to raise the performance of optoelectronics devices. The high density packaging of devices increases the heat generation from the package. The increase of the number of devices and the urgent necessity of heat diffusion are liable to enlarge the size of packages on the one hand. On the other hand, an increase of the amount of information enhances the maximum frequency of the signals treated by optoelectronic modules in communication systems. The use of high frequency and wide packages tends to cause cross-talk, and resonant noise or parasitic oscillation among semiconductor devices, electronic devices and wire patterns on the circuit plate. The cross-talk and the noise deform signals and decrease the signal to noise (S/N) ratio of the packaged devices.

These problems have been a primary focus of attention in (1) Japanese Patent Laying Open No.7-234337, (2) Japanese Utility Model Laying Open No.1-107141, (3) Japanese Patent Laying Open No.6-112345 and (4) Japanese Patent Laying Open No.2-28350. Proposed solutions bluntly dispose a single projecting partition at a middle position within the package. Such a middle-positioned partition would be effective in a small package having a symmetric arrangement of a signal sending part and a signal receiving part in the package. The use of a single partition, however, is ineffective for complicated circuits in which the sending part and the receiving part cannot be clearly isolated into distinct half portions of the package. Furthermore, the sole partition cannot suppress noise generation in large packages. In addition, since a single, large partition is formed on a cap or a package main body, the unevenness of the thickness of the cap or the package is liable to induce strong inner stress. The cap or the main body would suffer from thermal distortion by repetitions of cooling and heating.

(5) Satoshi Yamaguchi et al., IEEE MTT-S Digest 243 (1996) suggested a sophisticated improvement of narrowing the gaps between a semiconductor device and a package and reducing the volume of a free space in the package. However, the solution proposed in (5) is effective only for a simple package having a single device. It is inapplicable to complicated packages containing a plurality of ICs or other devices. The uneven thickness of the package would induce irregular distortion.

SUMMARY OF THE INVENTION

Although various proposals have been made for improved packages for preventing the occurrence of cross-talk and noise generated within a package, no such proposals has been completely satisfactory.

An objective of the present invention is to provide a cap of a package which can effectively prevent parasitic oscillation, the generation of noise and the cross-talk caused by coupling among high speed operating devices in a large package.

Another object of the present invention is to provide a cap which can suppress cross-talk regardless of the number of ICs or other electronic devices present in the package.

A further object of the present invention is to provide a semiconductor package having a cap which can suppress cross-talk, undesirable oscillation, and noise generation.

The cap of a semiconductor package has a plurality of metallic protrusions spaced at intervals which are less than $c/(2v\, \epsilon^{1/2})$, where c is the velocity of light in a vacuum, v is the maximum frequency of signals and $\epsilon$ is the dielectric constant of the circuit plate. In a typical embodiment of the invention a set of protrusions implanted on the cap has a common and unique spatial period $\lambda$ in two dimensions. However, in alternative embodiments, the protrusions do not have a common period. According to a further alternative embodiment, the protrusions on the cap can be randomly dispersed. In the case of the random distribution of the protrusions, the maximum distance between (interval) neighboring partitions should be less than $c/(2v\ \epsilon^{1/2})$. Thus $c/(2v\ \epsilon^{1/2})$ is the upper limit of the distances (intervals) between the nearest neighboring protrusions distributed on the bottom surface of the cap of the package according to this invention. This invention further proposes a semiconductor package having a cap with a plurality of protrusions dispersed on its bottom surface spaced at distances less than or equal to $c/(2v\ \epsilon^{1/2})$. In addition, this invention suggests a semiconductor module having the package covered by the cap provided with protrusions distributed at mutual distances less than or equal to $c/(2v\ \epsilon^{1/2})$.

The protrusions are made of metals or other conductive materials. The protrusions can take various shapes, for instance, a circular cone, an elliptical cone, an elliptical conical column, an elliptical column and so on. The protrusions suppress the noise, cross-talk and the oscillation by absorbing electromagnetic waves emitted by the various devices in the package. The only role of the protrusions is to absorb electromagnetic waves. Thus, the shapes of the individual protrusions are freely determined. For example, protrusions can include planar parts and can be shaped as triangular cones or pyramids.

Preferably planar parts should be excluded from the surfaces of protrusions for reducing the reflection of electromagnetic waves at the surfaces of the protrusions. Thus, desirable cross-sections are rounds or ellipses. Typically the protrusions should be formed periodically with a spatial period L in two dimensions on the bottom surface of the cap.

FIG. 3 and FIG. 4 show an example of the cap of the present invention. The cap 9 has many conical protrusions 12, 12, . . . formed periodically crosswise and lengthwise on the bottom surface. When the cap 9 is fitted to a package main body, the protrusions 12, 12, . . . are directed downward in the package. The protrusions 12 are preferably made of a metal or other conductive material for absorbing electromagnetic waves. But the planar part of the cap 9 may be an insulator, e.g. ceramics. In the example, side steps 11 are formed by thinning the periphery 10 of the cap 9. The side steps 11 will be inserted into a top opening of a package main body. In the embodiments shown in FIG. 3 and FIG. 4 the spatial period of the protrusions is less than or equal to $c/(2v\ \epsilon^{1/2})$.

FIG. 5 shows another example of the cap of the invention. The cap 9 has a set of circular sectioned columns 13 implanted on the bottom surface periodically with a period shorter than or equal to $c/(2v\ \epsilon^{1/2})$. In the example, the circular sectioned columns 13 can be replaced by elliptically sectioned columns or by elongated circular sectioned columns.

The upper limit (L) of the spatial distances (intervals) between the nearest neighboring protrusions is determined by the frequency of the signals processed by the semiconductor devices. Here "v" (Hz) refers to the highest frequency of the signals processed by the module. The dielectric constant of the circuit plate is denoted by $\epsilon$. The velocity of light in a vacuum is "c" ($3\times10^{10}$cm/s). The maximum of the spatial distances is limited by an inequality of $0<L\leq c/(2v\ \epsilon^{1/2})$. The meaning of the inequality will now be explained for clarifying the significance of the protrusions. If the frequency of the current signal is v, the wavelength $\lambda_0$ of the signal is given by $\lambda_0=c/v$. On the circuit plate, the velocity of light is decreased to $c/\epsilon^{1/2}$. Thus, the wavelength of the signal on the circuit plate is $\lambda=c/(v\ \epsilon^{1/2})$. A half of wavelength is $\lambda 2=c/(2v\ \epsilon^{1/2})$. This inequality suggests that the maximum distance of the protrusions should be shorter than or equal to a half wavelength. If the protrusions align periodically, the in equality requires that the spatial period should be shorter than or equal to a half wavelength ($L\leq \lambda/2$). In a rigorous meaning, $c/\epsilon^{1/2}$ is the phase velocity of electromagnetic waves just propagating on the circuit plate. The electromagnetic waves have a phase velocity c in vacuum. In a space in the package, the phase velocity of electromagnetic waves has an intermediate value between the vacuum velocity c and the circuit plate velocity $c/\epsilon^{1/2}$. The exact phase velocity cannot easily be calculated, because it depends upon the shape and the size of the package and the circuit plate. Further, the phase velocity changes according to the locus of the electromagnetic waves. For design purposes, it is suggested that you use the most rigorous standard by taking the shortest limit ($c/\epsilon^{1/2}$) for the phase velocity.

If the signal of frequency v forms standing waves in a package, the electric field makes peaks and valleys in a period of $\lambda/2$. Since the cap of the present invention is provided with metal protrusions spaced at less than or equal to $\lambda/2$, one wavelength contains at least two protrusions. All the protrusions are electrically connected and preferably grounded. The protrusions absorb energy from the wave by the plural contact points. Then the waves are attenuated by their contact with the protrusions. The set of protrusions prevents the formation of standing waves in the package. Due to the protrusions, no electromagnetic waves propagate in the package. Cross-talk among ICs, PDs, or LDs occurs by the electromagnetic waves standing in the package. Noise is generated by the electromagnetic waves in the package. Parasitic oscillation is excited by the electromagnetic waves. Since electromagnetic waves cannot exist in the package due to the highly-populating protrusions, the package becomes immune from the cross-talk, the noise generation and the parasitic oscillation. All of these benefits result from the use of protrusions distributed with a high density of $L\leq c/2v\ \epsilon^{1/2}$).

When the package and the disposition of ICs or other devices permit us to form protrusions downward from the bottom of the cap, the protrusions can be formed regularly with a period less than or equal to a half of wavelength. This is a simple case. However, sometimes the distribution of ICs or other devices forbids protrusions to occupy the spots distanced by a constant spatial period (L) in two dimensions. In some unfavorable regions, there is no room for implanting protrusions due to the presence of ICs or because of some other design consideration. In such a case, protrusions should be formed regularly at a constant distance in the favorable regions having sufficient room. Protrusions, however, should be omitted in regions that do not have sufficient room due to the existence of ICs or for some other reason. In such a case, some regions will have regularly-populated protrusions and others will not. The distances between neighboring protrusions will not be uniform. In such a case wherein there is a non-uniform distribution, this invention imposes an additional rule for giving a quasi-periodicity to the distribution of protrusions. The distances (intervals) between the nearest neighbors in one direction are denoted by $L_1$, $L_2$, $L_3$. Then $L_x$ is the greatest common measure of the intervals $L_1$, $L_2$, $L_3$. Instead of individual intervals, the greatest common measure (GCM) should satisfy the above inequality $0<L_x\leq c/(2v\ \epsilon^{1/2})$ in the quasi-periodicity case. The quasi-periodicity case also intends to maintain regular periodicity by utilizing the periodic mounting of protrusions in where possible, even though the protrusions are omitted where there is insufficient room for them.

The protrusions are made of a conductive material and are electrically connected with each other. Preferably, the protrusions are to be grounded. As shown is FIG. 11, for example, a protrusion-carrying cap 9 of the present invention can be fabricated by die-casting an aluminum alloy into a thin plate 70 having many periodic protrusions 12 and fastening the thin plate 70 to a ceramic cap plate 71 by welding or brazing. Other suitable materials could be substituted for aluminum alloy. The cap 9 includes two components, i.e., a thin plate 70 and a ceramic cap plate 71. In this case, the ceramic cap plate 71 which is intrinsically an insulator should be preliminarily coated with a thin metal film for welding or brazing. In the method, since the thin plate 70 is made as an independent part, a ready-made ceramic cap plate 71 can be furnished with the thin plate 70. The caps shown in FIG. 3, FIG. 4 and FIG. 5 can be fabricated by this method.

As an alternative, a protrusions-carrying cap can be made using a metal injection method (MIM) which injects molten metal into a cavity, cools the metal in the cavity and takes the metal product from the cavity. As a further alternative, a protrusion-carrying cap can also be made by a metal-powder sintering method by packing metal-binder powder in a mold, and then heating and pressing the powder in the mold. These methods can be used to fabricate a protrusion-carrying cap in only one step, which can save the steps of producing a protrusion plate and sticking the protrusion plate to the ceramic cap board. The preferable material for the complex cap is Fe, Ni, Co or a FeNi alloy which has a similar thermal expansion rate to ICs. The caps of FIG. 3, FIG. 4 or FIG. 5 can also be made by the above methods.

An effective protrusion-carrying cap can also be produced by attaching spongy foaming metal to a cap board. FIG. 6 and FIG. 7 show an example of a foaming metal arrangement. The cap 9 has a ceramic cap board and a sheet of spongy foaming metal 15 stuck with a conductive paste 14 on the bottom surface of the cap board. FIG. 8 is an enlarged view of a part of the spongy foaming metal 15. The foaming metal 15 which has many pores (small cavities) has a small specific gravity. The weight is very small for its volume. Still, it operates effectively to attenuate the propagation of electromagnetic waves within a package. The attenuation of electromagnetic waves is proportional to the volume of the shield (the protrusions or the sponge metal). The sticking of a dense metal plate increases the weight of the cap, which is inconvenient for handling. The sponge metal hardly increases the weight of the device but can be very effective for suppressing electromagnetic waves in the package.

The pores are dispersed at random. The size and shape of pores vary. There is no periodicity in the distribution of the pores in the sponge metal. The diameters Lp of the pores are all far smaller than a half wavelength $\lambda/2$ of the maximum frequency signal. The porous metal effectively forbids electromagnetic waves from propagating and forming standing waves in the package. The porous metal cap has some advantages over the previous ones. A sheet of sponge metal is easily pasted on the bottom surface of a cap plate. The sponge metal cap dispenses with the operation of welding small columns or pillars to a cap. The sponge metal method need not make a metallic mold of a complex protrusion-carrying cap. The sponge metal cap is superior in its ease of production.

The pores of the sponge metal have no periodicity. Thus the periodicity of the protrusions is not an absolute requirement of the present invention. The requirement of the invention is that there should be at least two conductive parts in a half $\lambda/2$ of wavelength of the maximum frequency of signals. When a half wavelength contains plural conductive parts connected together, no electromagnetic waves can exist in the package. No signals are transmitted from one device to another device due to the obstacles through the free space in the package.

The requirement mentioned thus far defines only the distribution of the protrusions in non-peripheral parts in a package. The rule of $L \leq c/(2v\ \epsilon^{1/2})$ cannot determine the margin of the set of protrusions. An additional requirement is imposed upon the distribution of protrusions at the peripheries in a package for reducing cross-talk, noise, etc. $L_y$ denotes the distance between the wall of a package and the nearest neighboring protrusion. The margin gap $L_y$ should satisfy a similar inequality of $0<L_y \leq c/(2v\ \epsilon^{1/2})$. This means that the margin itself should also be smaller than or equal to a half of wavelength.

All the protrusions should be electrically connected. Furthermore, it is preferable to connect the protrusions to the ground voltage (GND=0V) or to the source voltage (Vcc). It is desirable to connect the protrusions to the GND or to Vcc at many points to reduce the impedance of the connection. Such a connection can easily be accomplished by forming the structure of the package appropriately.

This invention suppresses cross-talk and noise by providing the cap of a hermetic-sealed package with a plurality of protrusions arranged so as to have a high density of $L \leq c/(2v\ \epsilon^{1/2})$. References (1), (2) and (4) suggest using a single partition. This approach is inadequate for our purposes because it induces deformation of the package and air leakage as a result of the single big partition. On the contrary, this invention does not cause such deformation because of the uniform distribution of a plurality of small protrusions. An added advantage of this arrangement is that thermal distortion is also suppressed, because we avoid the use of a large, single anisotropic partition wall. The package can maintain its hermetic (airtight) seal for a long time.

Reduction of noise requires the suppression of the cross-talk and the resonant oscillation in a semiconductor module. This invention suppresses the formation of standing waves by including many protrusions in the package. In general, the electromagnetic waves having a wavelength more than twice of the period of metal protrusions cannot maintain standing waves in the package. Therefore this invention forbids the standing waves by using protrusions whose distance is shorter than or equal to a half of wavelength.

Instead of using a single, large partition, this invention completely suppresses electromagnetic waves using many small protrusions. The conductive protrusions prohibit electromagnetic waves from propagating in the package. Even such protrusions having partially flat surfaces are also effective to supress electromagnetic waves. However, flat surfaces reflect electromagnetic waves partially and converges the waves. Noise may be induced by the reflection on the flat surfaces. Thus, it is preferable not to give flat surfaces to the protrusions. Desirable shapes for the protrusions are circular columns, circular cones, circular conical columns, elliptical columns, elliptical conical columns and elliptical cones. Here the adjectives of "circular" or "elliptical" mean the shapes of horizontal sections (xy-plane) of protrusions. In a circular shape of horizontal sections, "cone" means a bar having decreasing diameters along the length (z-direction) with a sharp edge. Namely, the diameter D is, e.g., described as $D=D_0(1-z)$, $(0 \leq z \leq 1)$, where $D_0$ is the diameter at the foot (z=0) and 1 is the height of a cone. "Column" means a bar having a constant diameter along the length ($D=D_0$). "Conical column" means a tapered bar having decreasing diameter with a flat end. Namely, $D=b(1-z)+D_1$ $(0 \leq z \leq 1)$, where 1 is the height of a conical column.

Strictly speaking, the distance (interval:L) is not the same as the period. This invention is defined by using inequalities containing the distance. It is not the period (T) but the distance (L) that determines whether electromagnetic waves propagate or not. However, physically what is important is not the period but the distance. This invention recommends small distances (L) which satisfy the inequality $L \leq c/(2v \epsilon^{1/2})$. Assuming periodically arranged protrusions, an equation $T=L+D$ gives a relation between the period (T) and the distance (L). Here, D is the diameter or the thickness of a protrusion. In the case of a circular column, D is a constant and the distance (L) is also a constant having a clear meaning. In the case of a circular cone $(D=D_0(1-z),$ $(0 \leq z \leq 1))$, however, the diameter D (z) and L (z) are variables in the z-direction in the direction of height in the equation $T=L+D$. Only the period T is a constant. At the tip, $D=0$ and $T=L$. At the tip, the period (T) coincides with the distance (L). Then, we take the tip value as the distance for cones. Namely, the period (T) is equal to the distance (L).

For that reason, we have sometimes represented the distances (L) by the period (T) in the case of conical protrusions. In other cases, the distance should not be confused with the period (T). The current parameter of the present invention is not the period (T) but the distance (L). Besides, the period (T) cannot be defined except for the case of periodically-populated matters. The distance (L) can also be defined as the distance between the nearest neighbors in the case of irregularly-distributed matters. The distance (L) is more convenient than the period (T) for defining or measuring.

Sometimes, it is difficult to allocate protrusions uniformly and overall on the bottom of a cap. For example, regularly implanted protrusions of the cap would come into contact with ICs, PDs, LDs or other electronic devices on the package, when the cap is coupled to the main body of the package. Periodicity should be partially abandoned, when it is difficult to make periodic protrusions on the cap. In the non-periodic case, the distances between the nearest neighbors should preferably be multiples of a standard distance L which satisfies the fundamental inequality $0<L \leq c/(2v \epsilon^{1/2})$. Thus, the distances at obstacles should be multiples of L, that is, 2L, 3L, 4L, 5L, 6L, 7L, 8L . . . . The distances have a definite greatest common measure (GCM):L. The standard distance L is the GCM. Preferably, the distances should be prime number times multiples of L, that is, 2L, 3L, 5L, 7L, 11L . . . Even when some distances exceed $c/(2v \epsilon^{1/2})$, no standing waves can exist in the package yet, since forgiven wavelengths in the gaps are different from each other.

The material of the protrusions must be an electrically conductive material. Any metals and conductive plastics can be used. Aluminum alloys are most suitable from the standpoint of ease of production. Arbitrary shaped products can easily be made from aluminum alloy powder by supplying aluminum powder into a metallic mold, pressing and heating the mold. Aluminum die-casting can be used to produce a complex cap having a set of protrusions on the bottom. High conductivity of aluminum effectively prohibits electromagnetic waves from propagating in the space of the package. Aluminum, however, has a drawback. The thermal expansion coefficient and thermal conductivity of aluminum are very high. Ceramic has a far lower expansion coefficient. An aluminum product (cap) can neither be soldered nor welded to a ceramic main body, even if the main body has preliminarily been metallized. Instead of making a unified cap from aluminum alloys, the cap itself should be produced from other material and the set of protrusions should be separately made from aluminum alloys. For example, the cap itself should be made of a FeNiCo alloy, e.g., KOVAR, or a FeNi alloy, e.g., 42 alloy. These alloys can be soldered or welded to other metals. Then, a plate having protrusions should be produced from an aluminum alloy. The cap board should be made from the above FeNiCo alloy or FeNi alloy. Then the aluminum plate should be stuck to the FeNiCo or FeNi made cap with an electrically conductive paste which has an effect of releasing stress. Although thermal expansion coefficients are different between the protrusion-plate and the cap, the intermediate paste will alleviate an occurrence of distortion. In the example, the cap has a two-story structure.

Of course, the cap itself and the protrusion plate can be made in a body. In the unified case, the cap should be made from a material which permits soldering and welding, since the cap must be directly stuck to a package main body by soldering or welding. The unified cap must be formed from powder metal by a metallic mold, since the cap includes complex protrusions. For example, the unified cap is produced at a stretch by the powder sintering method or the metal injection method (MIM) from metal powder of a FeNiCo alloy (KOVAR) or a FeNi alloy (e.g. 42 alloy). The unified cap has advantages in addition to ease of production. Since the entire structure is made from the same material, the cap is immune to distortion induced by differences of thermal expansion coefficients. Being homogeneous and isotropic, the unified cap has excellent in mechanical strength and heat resistance.

Further, effective protrusions can be easily made by adopting a porous, sponge foaming metal, for instance, "CELMET (trademark registered in the USA)" a porous mixture of metal and ceramic. Sponge metal intrinsically has a plurality of small pores (cavities). In many cases, the diameters of the pores are far smaller than $c/(2v \epsilon^{1/2})$, The average diameter of cavities can be controlled by the condition of the step of foaming. Instead of making anisotropic, individual protrusions, the sponge metal cap can be produced by pasting a rectangular foaming metal plate on the bottom of a cap board.

In order to reduce noise generation, it is desirable to keep the gap between the sides of the circuit plate and the package walls, the gaps between the circuit plate and the protrusions and the gaps between the protrusions and the ICs below $c/(2v \epsilon^{1/2})$.

The protrusions may be left at a floating level. It is preferable to connect the protrusions to the ground line (GND) or the source line (Vcc) of the circuit plate. Otherwise, the protrusions are connected to the ground level (GND) of the package. Stabilization of the voltage of the protrusions reinforces the power of annihilating noise.

This invention proposes a package with a cap having a plurality of small inward protrusions with narrow distances between them, unlike conventional packages having no partition or a large single partition. Uniformly dispersed small protrusions generate far smaller inner strain in the cap than the large single partition. The cap having dense populated protrusions does not distort. Thermal distortion is also alleviated by the uniform distribution of the small protrusions. The hermetic sealing of the present package has a high resistance against heat cycles.

The most conspicuous advantage of the invention is the complete suppression of the cross-talk and the parasitic oscillation in the packages for high frequency devices. Known packages having a single partition do not sufficiently suppress cross-talk or oscillation to a satisfactory extent.

Known arrangements were made without consideration about the distances among partitions and walls.

This invention restricts the distances between the neighboring protrusions to a short length less than or equal to a half of the wavelength of the signal wave. The signal cannot make standing waves in the package, since protrusions disturb the formation of the standing wave. Namely, the signal frequency cannot produce a space-propagating mode in the package. The absence of the propagating mode of the signal frequency prohibits high frequency waves emanating from some devices or wire patterns from transmitting to other devices or other wires in the package. The protrusions isolate individual devices and wire patterns from others electromagnetically. The isolation effectively suppresses cross-talk among the devices or the wire patterns. Protrusions also prohibit the parasitic oscillation which is induced by the spatial positive feedback of the output of an amplifier to the input of the same. This invention provides suitable packages for high frequency semiconductor device modules, since the package can suppress cross-talk, enhance the S/N rate and reduce noise.

DETAILED DESCRIPTION OF THE PREFERRED EMBODIMENTS

Embodiment 1—Conical Protrusions

Figure 1:
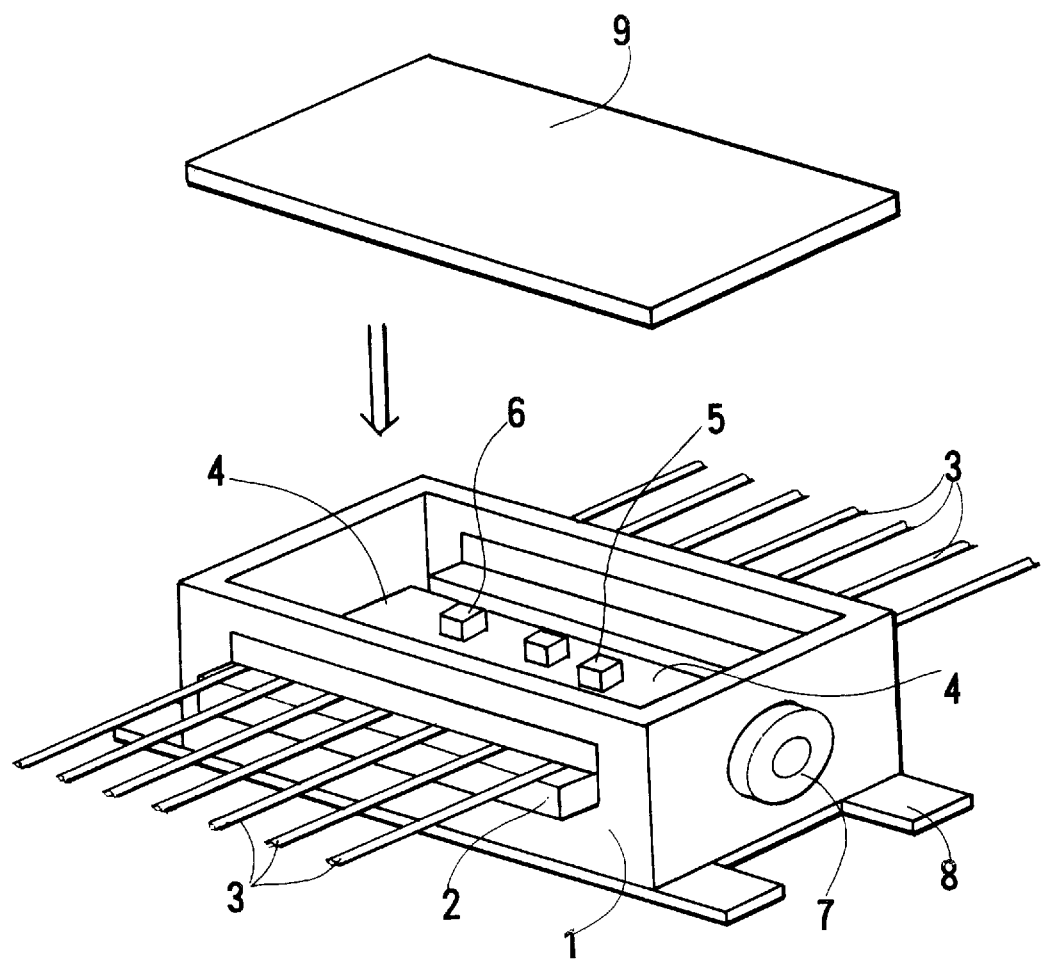
FIG. 1 is an exploded perspective view of a conventional package having a main body and a cap for storing semiconductor devices.
Figure 2:
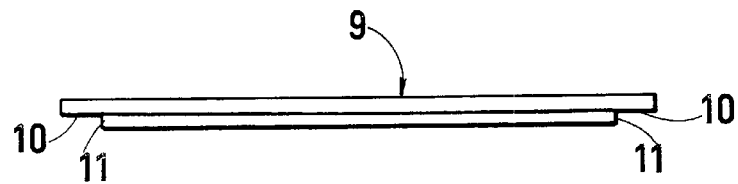
FIG. 2 is a side view of a cap of the conventional package.
Figure 3:
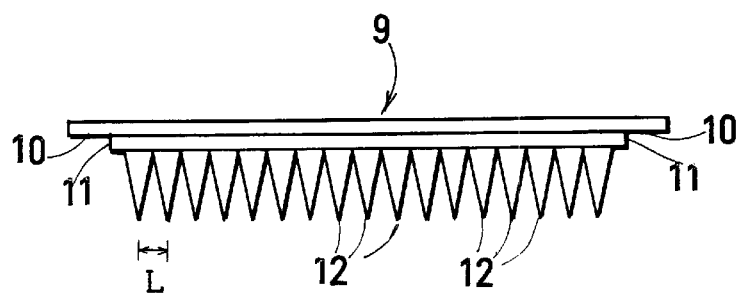
FIG. 3 is a side view of a cap with conical protrusions as an embodiment of the present invention.
Figure 4:
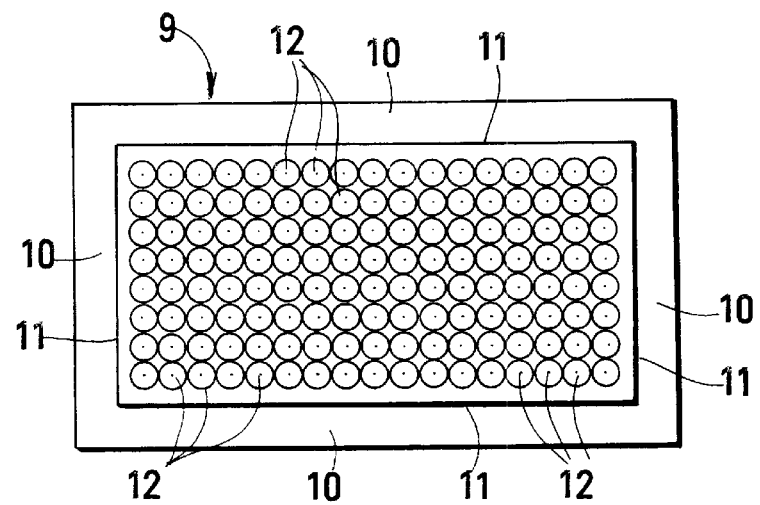
FIG. 4 is a bottom view of the same cap as FIG. 3.
Figure 11:
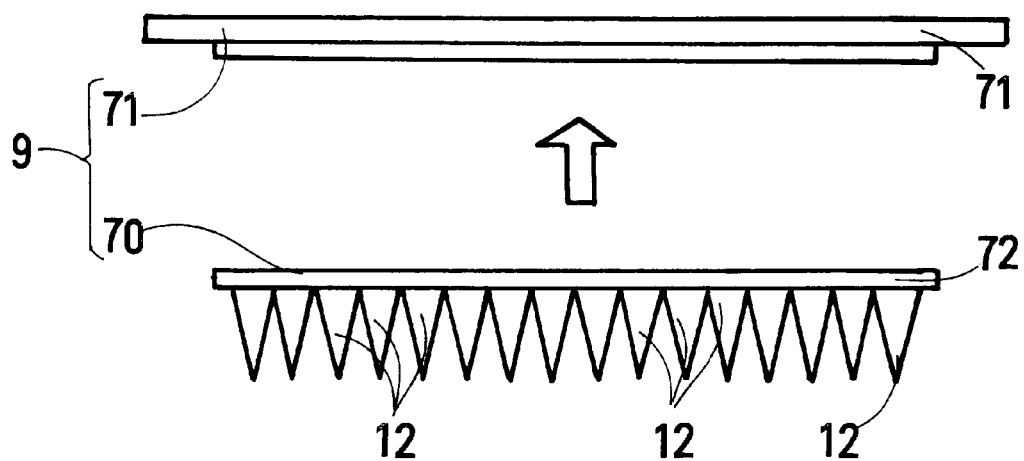
FIG. 11 is a side view of a decoupled cap including of a cap board and a protrusion-carrying plate.

An embodiment of the invention having conical protrusions is explained by referring to FIG. 3, FIG. 4 and FIG. 11. A flat rectangular metal board for a cap is made of KOVAR (trademark registered in the USA), one of FeNiCo alloys. A periphery 10 of the metal board is thinned by etching. Vertical steps 11 are formed by the etching of the periphery. The steps 11 have the same sizes as the top opening of a main body of a package. The bottom of the metal board is plated with a Ni/Au alloy which enables the cap board to weld a metallized main body.

In FIG. 11, a bottom thin plate 70 having many conical protrusions 12 is made by die-casting an aluminum alloy at a stretch. The bottom thin plate 70 has a thin rectangular plate part 72 and many circular protrusions 12 unified to the thin rectangular plate part 72 at their feet. The thin rectangular plate part 72 is further thinned by grinding till a 0.2 mm thickness for reducing stress distortion. Without the thin rectangular plate part 72, it would be inconvenient to stick many individual cones to the metal board one by one. The bottom thin plate 70 with the protrusions 12 is stuck to the bottom of the ceramic cap plate 71 by an Ag paste. As shown in FIG. 3, FIG. 4 and FIG. 11, this embodiment is a cap allocating circular protruding cones crosswise and lengthwise at the same period (T) on the bottom. Neighboring cones are in contact with each other at the feet. The period (T) is equal to the diameter at the foot. Since the protrusions are cones, the set of protrusions can easily be produced by using a metallic mold. The period (T) is determined to be a length less than or equal to a half of wavelength of the maximum frequency, namely $T \leq c/(2v\ \epsilon^{1/2})$. Although the density of protrusions should be defined by the distances, in the case of the conical protrusions, the distribution can be defined by the notation of the period, since the period (T) is equal to the distance (L) at the tip of the cones. A semiconductor module is produced by fitting the unified cap 9 to the main body of the package provided with circuit plates, ICs, PDs or LDs. In the module, the protrusions extending downward prohibit electromagnetic waves from propagating in the inner space. Neither cross-talking nor parasitic oscillation occurs among ICs, PDs, LEDs or LDs. Noise due to the interaction is also suppressed by the intervention of the protrusions. This embodiment uses circular cones as protrusions. The circular cones can be replaced by pyramids or elliptical cones.

Embodiment 2—Columnar Protrusions

Figure 5:
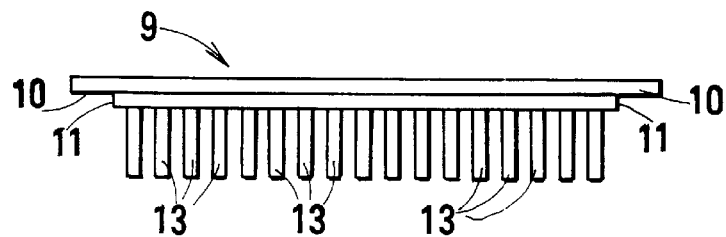
FIG. 5 is a side view of a cap according to another embodiment of the present invention.

Conical protrusions can be replaced by columnar protrusions. FIG. 5 shows such an embodiment having a plurality of elliptical columns formed on the bottom of a cap board. A flat KOVAR, a FeNiCo alloy, board is employed for a cap board. The periphery is thinned by etching. The etching process makes a thinned periphery 10 as a flange and side steps 11 of the cap. The surface of the board is plated with a Ni/Au alloy for the convenience of welding. These processes are similar to the previous embodiment. The shape of a protrusion is different. The protrusion is a column with an elliptical section. Here, column means a bar having the same section along the length. The columnar protrusions are arranged crosswise and lengthwise at the same period. The distance (interval) between the nearest neighbors is less than or equal to $c/(2v\ \epsilon^{1/2})$. The ellipse sectional shape is also replaced by a circle or a polygon. The polygons, however, are less favorable than the ellipses or the circles, because the edges of the polygons are likely to induce accidental electric discharge. Preferable protrusions have no linear parts in their horizontal sections for avoiding discharge. The distance (interval) includes some ambiguity except the circular column. On the contrary, the periodicity has a clear, definite significance owing to the periodic distribution. Then an average diameter D can be defined for the columns. The distance (or interval: L) can be safely approximated by the difference between the period (T) and the average diameter (D), that is, L=T−D.

The protrusion-carrying thin plate 70 was produced by die-casting an aluminum alloy. All the protrusions are unified at the tops by the plate. After the die-casting, the blank surface of the thin plate was ground till a thickness of 0.2 mm for reducing inner strain. Like the former embodiment, the thin plate is stuck to the bottom of the cap board with an Ag paste. The protrusions attenuate electromagnetic waves propagating in the package, since they are aligned in the intervals shorter than a half of wavelength.

Periodicity of the Protrusions

The upper limit (L) of the intervals of the protrusions is determined by the equation $L=c/(2v\ \epsilon^{1/2})$ which includes a term representing the dielectric constant of the circuit board. Usually, aluminum ($Al_2O_3$) circuit boards are used for the modules of semiconductor devices. Alumina has various kinds of versions having different compositions and different dielectric constants. Here the maximum period is estimated by assuming a dielectric constant $\epsilon=9$ for an alumina board. The maximum frequency of 5 GHz for the semiconductor module gives a half of wavelength $\lambda/2=c/(2\ v\ \epsilon^{1/2})=10$ mm. This invention requires the period L of the protrusions to be shorter than the half wavelength of the maximum signal frequency. Then, the period L should be determined to be a value shorter than 10 mm in the case of 5 GHz.

The package of the module is, for example, a square of 30 mm×30 mm. The diagonal line is 42 mm in length. The number of protrusions is determined to be 25 for narrowing the gaps between the package side walls and the peripheral protrusions. The space of 25 mm×25 mm is divided into 5× 5 squares by five 4×4 lines. 25 protrusions are allocated to the centers of the 5×5 squares. The distances between the neighboring protrusions are 5 mm in the crosswise direction and in the lengthwise direction. The distances are about 7 mm in the diagonal direction. The gaps between the side wall and the nearest protrusions are 2.5 mm. All the distances in all the directions are shorter than 10 mm. The package satisfies the requirement of the present invention. The protrusions are round cones of a 2.5 mm radius at foot and a 5 mm height like Embodiment 1 of FIG. 3. Such a disposition of 5×5 squares can also be applied to Embodiment 2 of FIG. 5.

Embodiment 3—Foaming Metal Sheet Cap

Figure 6:
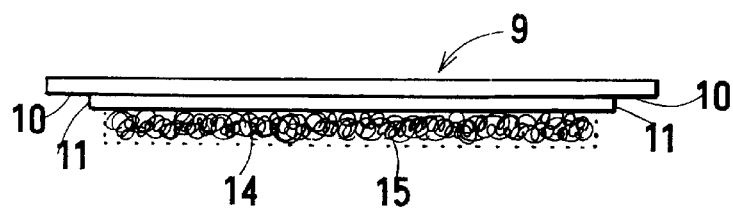
FIG. 6 is a side view of a cap with sponge metal according to a further embodiment of the present invention.
Figure 7:
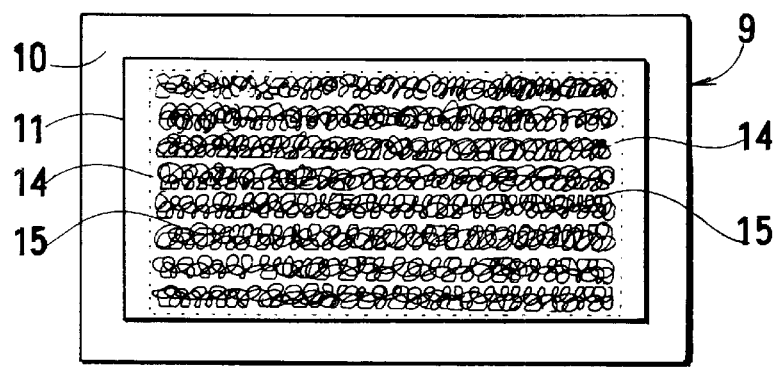
FIG. 7 is a bottom view of the cap shown in FIG. 6.
Figure 8:
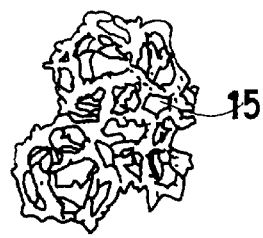
FIG. 8 is an enlarged perspective view of a part of sponge, foaming metal.

This embodiment dispenses with the process of making protrusions. Regularly arranged protrusions are replaced by random distributed pores in foaming metals. A sponge, foaming metal 15 is cut and shaped into a thin plate. The sponge metal plate 15 has no protrusions but many random pores with various shapes and various sizes. The sponge metal plate 15 is stuck to a cap board with a conductive (Ag) paste 14, as shown in FIG. 6 and FIG. 7. The chosen sponge metal has pores of an average diameter $L_o$ which is shorter than a half (10 mm for 5GHz) of wavelength of signals, namely, $L_0 \leq c/(2v\ \epsilon^{1/2})$. The material of the foaming metal is nickel (Ni) or iron (Fe). Ni foaming metal can be adopted as it is, since Ni is not rusted. But Fe sponge metal must be plated by nickel and gold (Ni/Au), because Fe gets rusty.

The sponge metal stuck to the cap board can shield electronic devices from electromagnetic waves. The use of the foaming metal can do without the metallic molds and the operation of die-casting protrusion-carrying metal plates. The choice of the foaming metal facilitates the design of the cap by leaving the locations of individual protrusions out of consideration.

Embodiment 4—Protrusions Unified With Cap

Semiconductor modules are sometimes used under conditions in which there is strong vibration or strong acceleration. These conditions give rise to a new problem related to the pasting with Ag of the protrusions on the cap board. Strong vibration would induce separation of the protrusions from the cap board. Severe conditions require a more reliable structure of the cap. Embodiment 4 produces a cap unified with protrusions at a stretch with a mold. A protrusion-carrying cap is produced by injection molding from KOVAR, a FeNiCo alloy or from 42 alloy, a FeNi alloy. The cap with protrusions as shown in FIG. 3 or FIG. 4 is produced at a stroke. The protrusions thus formed will not separate from the cap by strong vibration or acceleration, since the cap has been made as a unitary construction. This particular arrangement is inexpensive to produce because the pasting operation is eliminated.

Kovar, a FeNiCo alloy, is preferable for the material of a cap for the main body of the package made of KOVAR, aluminum nitride (AIN) or a 10%Cu CuW alloy composed of W and Cu in a ratio of W:Cu=90:10. 42 alloy is suitable for the material of a cap, when the main body is made from alumina ceramics or a 20%-Cu CuW alloy composed of W and Cu in a rate of W:Cu=80:20. The unitary construction cap excels in thermal stability, since it has no junction. It can be joined to the main body of the package by brazing of AuSn or PbSn. The thermal stability of the unified cap enhances the reliability of hermetic sealing.

Embodiment 5—Quasi-Periodic Protrusions

Sometimes the location of devices in a package prohibits the protrusions from distributing periodically on the cap board. For example, edges of some regularly-planted protrusions collide with ICs, PDs or LDs in the package. In such case, protrusions are not formed where there is no room for them. Still, electromagnetic waves are suppressed.

Figure 9:
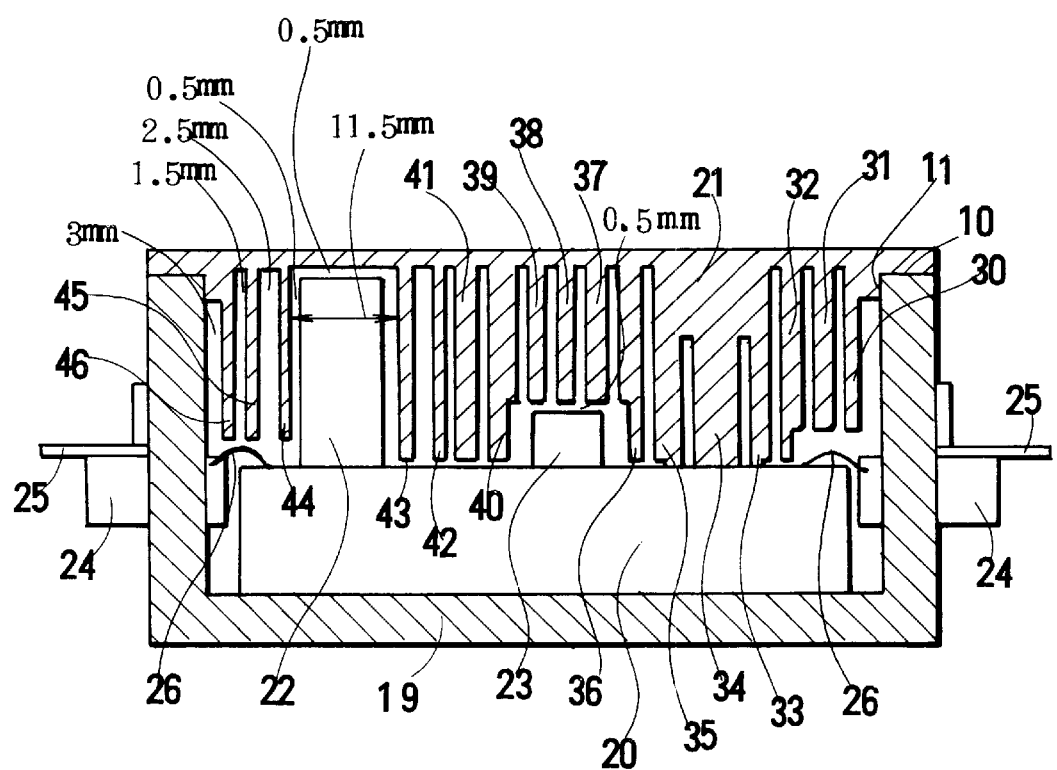
FIG. 9 is a vertically-sectioned view of a semiconductor device having non-periodic protrusions according to another embodiment of the present invention.

FIG. 9 shows an example of the quasi-periodic distribution of protrusions. A main body 19 of a package contains a circuit board 20. A protrusion-carrying cap 21 is coupled to the main body 19. The inner space of the package is hermetically sealed by the cap 21. There is a tall electronic device 22 and a tall semiconductor device 23 on the circuit board 20. Terminal boards 24 having parallel wiring patterns penetrate side walls of the package. Leads 25 are glued to the ends of the wiring patterns on the terminal boards 24. The other ends of the wiring patterns on the terminal boards 24 are connected by wires 26 to the ends of circuit patterns on the circuit board 20. The existence of the tall devices 22 and 23 impedes a completely periodic arrangement of protrusions. There are two ways of modifying the periodicity of the arrangement of protrusions.

One possible modification to the structures already described is planting all the protrusions at periodic spots and shortening the protrusions at the regions of the tall devices not to touch the devices. Although some protrusions are cut short, the set of the protrusions can hinder electromagnetic waves from propagating as a whole. In FIG. 9, the cap 21 has many protrusions 30 to 46. The middle three protrusions 37, 38 and 39 are cut short at the edges in order to avoid the contact to the device 23. Other protrusions 36 and 40 are partially cut for separating from the device 23. The protrusions 30, 31, 44, 45 and 46 above the wires 26 are slightly shortened not to touch the wires.

Sometimes it may be insufficient to cut the edges of the protrusions which exist above ICs, devices or other tall parts. In this case, it is preferable to eliminate the protrusions from the feet . Thus, no protrusions exist above the electronic devices 22. However, there should still be periodic protrusions at other places. The periodicity should be maintained so long as the distribution of devices permits. In the semi-periodic distances, the greatest common divisor (GCD or greatest common measure GCM) is denoted by $L_x$. Instead of L, the largest common divisor Lx should be less than or equal to a half of the wavelength of the electromagnetic waves propagating in the package. Thus, $L_x \leq c/(2\epsilon^{1/2})$.

For example, assuming that the maximum frequency v is 80 GHz and the dielectric constant $\epsilon=9$ for aluminum circuit board, the half ($\lambda/2$) of the wavelength is 0.625 mm ($c/2v\ \epsilon^{1/2}$). Thus the greatest common divisor $L_x$ is determined e.g.

to be $L_x$=0.5 mm. The minimum distance between the nearest neighbors is 0.5 mm. The other semi-periodic distances between the nearest neighboring protrusions should be determined to be one of multiples of $L_x$. Further, the multiples by prime numbers are more desirable than the multiple by non-prime numbers. Then, the semi-periodic distances between the protrusions separated by tall devices should be determined to be 1.5 mm, 2.5 mm, 3.5 mm, . . . 11.5 mm and so forth. Multiples by even numbers are permitted for the distances but some multiples by prime numbers are required for maintaining $L_x$ as the greatest common divisor GCD. If all the semi-periodic distances were multiples of even numbers, the GCD would be heightened to $2L_x$. In FIG. 9, the basic distance is 0.5 mm. The distance between the protrusions 45 and 46 is 1.5 mm which is three times as long as the basic one. The distance between the protrusions 44 and 45 is 2.5 mm which is five times longer than 0.5 mm. The distance between the protrusions 46 and the wall is 3 mm, i.e. a six times multiple of the basic length. The distance between the protrusions 43 and 44 is 11.5 mm which is twenty-three times as long as the basic length.

Heights of Protrusions

The heights of protrusions may be a uniform on a cap board. Non-uniform heights are also permitted for the protrusions of the invention. It is desirable to connect the protrusions to the ground voltage (V=0) for protecting the inner circuit from external noise. In FIG. 9, the edges of the protrusions 33, 34 and 35 are in contact with the ground patterns of the circuit on the circuit board 20. The contact grounds all the protrusions, since all the protrusions are mutually connected with each other at the feet. For the protrusions separated from the circuit board 20, it is advantageous to keep the gaps $L_w$ between the edges and the electronic devices less than or equal to a half of wavelength ($L_w \leq c/(2v\ \epsilon^{1/2})$). In FIG. 9, the gaps between the edges of the protrusions and the devices 22, 23 are 0.5 mm.

Embodiment 6—Semiconductor Device Module

Figure 10:
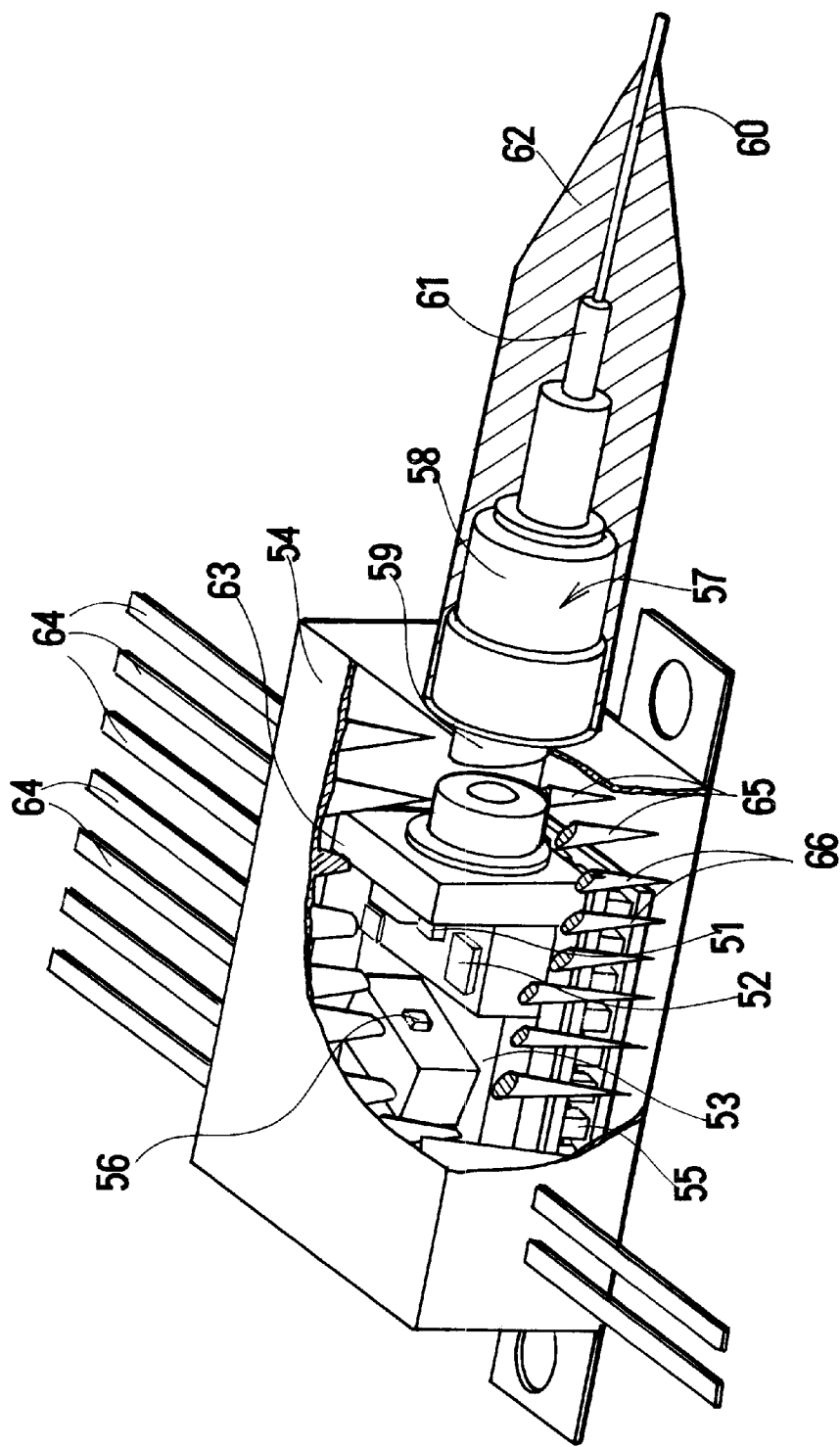
FIG. 10 is a partially-sectioned, perspective view of a LD module stored in the protrusion-carrying package of the present invention.

FIG. 10 shows an embodiment of a semiconductor device module stored in a package with a cap having periodic protrusions. This is an example of a laser diode module which has inherently another problem of the heat generation in addition to the cross-talk or the parasitic oscillation. A laser diode 51 and a driving IC 52 are mounted on a circuit board 53 which is stored in a package 54. The laser diode 51 yields much Joule heat. The module requires a cooling device. The laser diode should be maintained at a constant temperature (for example 25° C.), because the change of environmental temperature fluctuates the oscillation frequency of the laser. A Peltier device 55 is furnished under the circuit board 53 in the package 54 for cooling the laser diode 51. A monitoring PD (photodiode) 56 is disposed at the back of the laser diode 51 for monitoring the power of the laser diode 51. The package 54 is equipped with a holder 58 for an optical device 57. The holder 58 contains some optics, e.g., a lens. An oblique-cut glass block 59 is upholstered at the final end of the holder 58. A ferrule 61 having an end of an optical fiber 60 is inserted into the front end of the holder 58. An elastic bend limiter 62 covers the holder 58 and the end of the optical fiber 60. Beams emanating from the laser diode 51 are converged by the lens (the optical device 57), enter the optical fiber 60 and propagate in the optical fiber 60.

A plurality of protrusions are planted on the inner surface of the cap of the package. The protrusions are made of a metal. All the metal protrusions are biased at a common voltage in order to prevent electromagnetic waves from propagating in the package. In particular, it is preferable to bias the protrusions to the ground voltage. Some protrusions 65 and 66 are in contact with the bottom of the package 54. Some other protrusions above a tall saddle 63 are cut short not to touch the saddle. Lead frames 64 extend horizontally from both sides of the package 54. When the same laser device was stored in a conventional package without protrusions, the parasitic oscillation did occur. No parasitic oscillation happened in the package with the protrusions.

Planting of protrusions on the bottom of the cap board may invite a new problem of distortion due to the inhomogeneity of the cap surface. However, the cap is actually free from distortion. The junction between the cap and the main body of the package is stable and reliable in spite of the protrusions. Gas did not leak from the protrusion-carrying package. The embodiment satisfied the gas leak criterion which requires that the gas leak per a second at the atmospheric pressure should be less than $2 \times 10^{-8}$ atmcc/sec stipulated by the MIL-STD883.

Furthermore, it was proved that this invention has an effect of reducing thermal distortion. The Bell-core STD stipulates a thermal test which examines the property of semiconductor device packages under the heat-cycles of raising and lowering the temperature of the packages ten times between −40° C. and +150° C. The package satisfied the gas leak criterion of less than $2 \times 10^{-8}$ atmcc/sec of the MIL-STD883 still after the heat-cycles.

Embodiment 7—Relation Between Distance and Frequency

This invention suppresses electromagnetic waves from propagating in a package by planting protrusions periodically on the cap board. The optimum distance L between the nearest neighboring protrusions depends upon the frequency v of the electromagnetic waves. The distance L should be shorter than a half of the wavelength. Here, the relation between the distance L and the frequency v is examined. Various electronic devices which operate at different frequencies have been prepared and mounted on circuit boards in rectangular packages of 100 mm×100 mm. Such a 100 mm×100 mm package is a very large package. Since a small package cannot reveal the effect of the present invention clearly, this examination employed big packages having a wide space. Another reason is that $100(=2^2 \times 5^2)$ has a lot of divisors which facilitates to select many candidates of distances. The occurrence of oscillation was examined by changing the distances between the protrusions at four different frequencies. The test maximum frequencies were 2.5 GHz, 5 GHz, 10 GHz and 20 GHz. The distances are 2.5 mm, 5 mm, 7.5 mm, 10 mm, 15 mm, 20 mm, 30 mm and 40 mm. The four frequencies and the eight distances make 32 cases of modules of different conditions. 32 kinds of modules were actually made, driven and tested whether parasitic oscillation occurred or not. Table 1 shows the result of the test. Rounds "O" denote no occurrence of oscillation. Crosses "x" denote an occurrence of oscillation.

TABLE 1

Relations among the occurrence of oscillation, the intervals of protrusions and the maximum frequencies of signals in packages having protrusions

| INTERVAL | MAXIMUM FREQUENCIES (GHz) | | | |
|---|---|---|---|---|
| L (mm) | 20 | 10 | 5 | 2.5 |
| 2.5 | 0 | 0 | 0 | 0 |
| 5 | × | 0 | 0 | 0 |
| 7.5 | × | × | 0 | 0 |
| 10 | × | × | 0 | 0 |
| 15 | × | × | × | 0 |
| 20 | × | × | × | 0 |
| 30 | × | × | × | × |
| 40 | × | × | × | × |

×: oscillation happened.
0: no oscillation occurred.

When the frequency is 20 GHz and the circuit board is alumina of $\epsilon=9$, the wavelength of the signals propagating on the dielectric lines on the board is 5 mm. A half of the wavelength is 2.5 mm. Indeed no oscillation happened in the case of the distance of 2.5 mm. Dense populated protrusions of a 2.5 mm distance can suppress the oscillation. Oscillation did occur in the cases of more sparsely populated protrusions of the distances wider than or equal to 5 mm for 20 GHz. When the frequency is 10 GHz and the circuit board is the same alumina, the wavelength of the signal on the circuit board is 10 mm. A half of the wavelength is 5 mm. The test modules of the distances of 2.5 mm and 5 mm were immune from the oscillation. The modules of the distances longer than or equal to 7.5 mm were annoyed by the parasitic oscillation.

When the frequency is 5 GHz, the wavelength of the alumina of $\epsilon=9$ is 20 mm. A half of the wavelength is 10 mm. The modules of the distances of 2.5 mm, 5 mm, 7.5 mm and 10 mm were free from oscillation. But the modules of the distances longer than or equal to 15 mm are plagued by oscillation.

The wavelength is 40 mm for 2.5 GHz. A half of the wavelength is 20 mm. The modules of the distances of 2.5 mm to 20 mm can suppress the oscillation. But the oscillation occurs in the modules of the distances of 30 mm and 40 mm.

The examination surely verified the idea of the present invention that the protrusions of a distance Lx shorter than or equal to $c/(2v \epsilon^{1/2})$ can effectively suppress the oscillation.

A similar experiment was done for the modules with protrusions which are partially cut short. The examination proved that the small distance shorter than or equal to $c/(2v \epsilon^{1/2})$ can effectively prohibit the oscillation.

Furthermore, the fact was also verified that the ratio of S/N (signal to noise) is raised through the suppression of noise by extending the edges of protrusions into contact with the GND patterns of the circuit board. An increase of the contact points to the GND still further enhances the S/N ratio. It was also certified that the restriction of the wall-protrusion clearances to less than or equal to a half of the wavelength is effective.

What I claim is:

1. A semiconductor device package comprising:
    a main body for storing at least one semiconductor device and at least one circuit board, the main body having a circuit plate forming a bottom portion of the main body; and
    a cap sealing a top opening of the main body, the cap having a cap board, wherein a plurality of electrically-conductive protrusions distanced by intervals less than or equal to $\{c/(2v\epsilon^{1/2})\}$ are arranged on a bottom surface of the cap board, where v is the maximum frequency of signals processed by the semiconductor device and the circuit board $\epsilon$ is the dielectric constant of the circuit plate, and c is the velocity of light in a vacuum.

2. A semiconductor device package as claimed in claim 1, wherein horizontal sections of the protrusions contain no linear parts.

3. A semiconductor device package as claimed in claim 1, wherein the protrusions are aligned lengthwise and crosswise on the bottom surface of the cap board with a constant interval L which satisfies an inequality of $0<L<C/(2v \ \epsilon^{1/2})$.

4. A semiconductor device package as claimed in claim 1, wherein the protrusions are distanced- by different intervals $L_1, L_2, L_3, \ldots L_n$, and the different intervals have the greatest common divisor Lx which satisfies an inequality of $0 \leq Lx \leq \{c/(2v \ \epsilon^{1/2})\}$.

5. A semiconductor device package as claimed in claim 1, wherein the protrusions are made of aluminum or an aluminum alloy.

6. A semiconductor device package as claimed in claim 1, wherein the cap board and the protrusions are made of metal.

7. A semiconductor device package as claimed in claim 1, wherein a metal plate having protrusions is attached to the bottom surface of the cap board.

8. A semiconductor device package as claimed in claim 6, wherein the protrusions are made from Fe, Ni, Co, a FeNi alloy or a FeNiCo alloy.

9. A semiconductor device package as claimed in claim 7, wherein the protrusions are made from Fe, Ni, Co, a FeNi alloy or a FeNiCo alloy.

10. A semiconductor device package as claimed in claim 1, wherein the protrusions comprise foaming metal formed on the bottom surface of the cap board.

11. A semiconductor device package as claimed in claim 1, wherein the protrusions are columns having a same sectional shape along the lengthwise dimension.

12. A semiconductor device package as claimed in claim 11, wherein the sectional shape is a circle.

13. A semiconductor device package as claimed in claim 11, wherein the sectional shape is an ellipse.

14. A semiconductor device package as claimed in claim 1, wherein the protrusions are cones having reducing diameters along the lengthwise dimension.

15. A semiconductor device package as claimed in claim 14, wherein the protrusions have a circular sectional shape.

16. A semiconductor device package as claimed in claim 14, wherein the protrusions have an elliptical sectional shape.

17. A semiconductor device module for storing at least one semiconductor device and at least one circuit board and having a circuit plate forming a bottom portion of a main body of the module, the module comprising:
    a package for storing the at least one semiconductor device and the at least one circuit board; and
    a cap for covering the package, the cap having a cap board and a plurality of protrusions distanced by intervals shorter than or equal to $\{c/(2v\epsilon^{1/2})\}$, where c is the velocity of light in a vacuum, v is the maximum frequency of signals processed by the semiconductor device and the circuit board, and $\epsilon$ is the dielectric constant of the circuit plate.

18. A semiconductor device module as claimed in claim 17, wherein distances $L_w$ between the protrusions and the semiconductor devices of the circuit boards satisfy an inequality of $0<L_w \leq \{c/(2v\epsilon^{1/2})\}$.

19. A semiconductor device module as claimed in claim 17, wherein distances $L_y$ between the protrusions and walls of the package satisfy an inequality of $0<L_y \leq \{c/(2v\epsilon^{1/2})\}$.

20. A semiconductor device module as claimed in claim 17, wherein a portion of the protrusions are in contact with ground patterns or source patterns on the circuit boards or with walls of the package.

21. A semiconductor device module as claimed in claim 17, wherein the protrusions comprise foaming metal formed on a bottom surface of the cap board.

22. A cap for sealing a top opening of a semiconductor device package the device package for storing a number of semiconductor devices, the cap comprising;

a cap board; and a plurality of electrically-conductive protrusions distanced by intervals less than or equal to $\{c/(2v\epsilon^{1/2})\}$ on a bottom surface of the cap board, where v is the maximum frequency of signals processed by the semiconductor devices, $\epsilon$ is the dielectric constant of a circuit plate of the semiconductor device package and c is the velocity of light in a vacuum.

23. A cap as claimed in claim 22, wherein the protrusions comprise foaming metal formed on a bottom surface of the cap board.

* * * * *